(12) United States Patent
Arai et al.

(10) Patent No.: US 7,475,412 B2
(45) Date of Patent: Jan. 6, 2009

(54) OPTICAL DISK DRIVE APPARATUS HAVING A FLEXIBLE SUBSTRATE AND WIRING CONDUCTORS

(75) Inventors: Satoshi Arai, Fujisawa (JP); Hiroaki Furuichi, Kawasaki (JP); Yoshio Oozeki, Ebina (JP); Hideo Sotokawa, Yokohama (JP); Mitsuo Satake, Yokohama (JP); Kazuhiko Ito, Yokohama (JP); Masayoshi Watanabe, Yokohama (JP)

(73) Assignee: Hitachi Media Electronics Co., Ltd., Mizusawa-shi (JP)

( * ) Notice: Subject to any disclaimer, the term of this patent is extended or adjusted under 35 U.S.C. 154(b) by 367 days.

(21) Appl. No.: 11/333,171

(22) Filed: Jan. 18, 2006

(65) Prior Publication Data
US 2006/0161940 A1     Jul. 20, 2006

(30) Foreign Application Priority Data
Jan. 18, 2005   (JP)   ............................. 2005-010495

(51) Int. Cl.
G11B 7/09   (2006.01)
(52) U.S. Cl. ...................................... 720/685
(58) Field of Classification Search ................... 720/685
See application file for complete search history.

(56) References Cited

U.S. PATENT DOCUMENTS 6,160,780 A * 12/2000 Furukawa et al. ........... 720/604
6,931,650 B2 * 8/2005 Matsumura et al. ......... 720/685
7,131,130 B2 * 10/2006 Hara et al. .................. 720/689
2005/0086677 A1 * 4/2005 Ochi et al. .................. 720/659
2006/0005215 A1 * 1/2006 Wu ............................. 720/652
2006/0117332 A1 * 6/2006 Ochi et al. .................. 720/659

FOREIGN PATENT DOCUMENTS

| JP | 08-096390 | 4/1996 |
|---|---|---|
| JP | 09-320078 | 12/1997 |
| JP | 2004-063356 | 2/2004 |

* cited by examiner

Primary Examiner—Angel A. Castro
(74) Attorney, Agent, or Firm—Antonelli, Terry, Stout & Kraus, LLP.

(57) ABSTRACT

In order to improve reliability of an optical disk drive apparatus at low cost, a flexible substrate for making connection between an optical pick-up device incorporated in the optical disk drive apparatus and a drive side is divided into a first flexible substrate fixed to the optical pick-up body (for example, upper surface), and a second flexible substrate connected to the first flexible substrate and extending to the drive, wiring conductors formed on a connection end portion of the first flexible substrate and wiring conductors formed on a connection end portion of the second flexible substrate are superposed at a region adjacent an end of the case of the optical pick-up device body, and connected to each other by joining material, and a connection section between the wiring conductors is held down by a cover for protecting the optical pick-up device body.

14 Claims, 14 Drawing Sheets

TESTING PORTION

OPTICAL DISK DRIVE APPARATUS HAVING A FLEXIBLE SUBSTRATE AND WIRING CONDUCTORS

The present application claims priority from Japanese application JP2005-010495 filed on Jan. 18, 2005, the content of which is hereby incorporated by reference into this application.

BACKGROUND OF THE INVENTION

1. Field of the Invention

The present invention relates to a thin optical pick-up device that is used for regeneration and recording of an optical disk such as a CD (Compact Disk), a DVD (Digital Versatile Disc) or the like, and to an optical disk drive apparatus in which the thin optical pick-up device is incorporated.

2. Description of the Related Art

The techniques that relates to an optical disk drive apparatus and an optical pick-up device incorporated therein are disclosed in, for example, Japanese Patent Application Laid-Open No. Hei. 8-96390 (Patent Document 1) and Japanese Patent Application Laid-Open No. Hei. 9-320078 (Patent Document 2).

The Patent Document 1 discloses that, in an optical pick-up which is supported to a biaxial actuator, receives return light beams from a surface of an optical disk through a photodetector (photodetector device), and takes out an output signal from the photodetector, a flexible printed circuit board is arranged on a side surface of a body of the optical pick-up, connecting cords for transmitting a drive control signal of the biaxial actuator and the output signal from the photodetector are connected to the flexible printed circuit board, and lands are formed at respective connection portions of the flexible printed circuit board to which the connecting cords are connected. At the connection portions of the flexible printed circuit board to the connecting cords, a plurality of lands that respectively correspond to signal lines connected to the connecting cords are formed. At the connection portions of the connecting cords (hereinafter referred to as "end portions of an optical pick-up side"), a plurality of lands are formed so as to be respectively contacted with the lands formed on the flexible printed circuit board. The connecting cords are forcedly contacted, at the end portions of the optical pick-up side, with the flexible printed circuit board provided on the side surface of the optical pick-up, by a pressing element comprised of elastic material.

Also, the Patent Document 2 discloses that in a moving magnet-type optical pick-up in which a permanent magnet is wound around a lens holder holding an objective lens, there is provided an optical pick-up in which improvement in assembly operation is achieved and the number of parts is reduced, by inserting a second drawing flexible substrate into a hole of a first flexible substrate, positioning the second drawing flexible substrate, and causing the second drawing flexible substrate to be subjected to soldering.

Also, Japanese Patent Application Laid-Open No. 2004-63356 (Patent Document 3) describes that, in a flexible substrate having a complex shape, there is provided a flexible substrate in which wastage of a material plate is reduced by causing several pieces into which a flexible substrate is divided, to be engaged or connected to one another, thereby increasing the number of flexible substrates from the material plate.

SUMMARY OF THE INVENTION

According to high-functionalization of a recent optical pick-up device, a portion of a printed circuit board (flexible substrate) connecting a body of the optical pick-up device and a drive side of an optical disk drive apparatus to which the optical pick-up device body is to be mounted, which is fixed to the optical pick-up device body is formed as so-called multi-layer substrate in which a plurality of layers on which wirings are formed are isolated from one another through insulating films and laminated to one another, in order to comply with high-densification of signal wirings formed on the portion of the printed circuit substrate, and reduction of a mounting area (area of the flexible substrate) in the optical pick-up device body is attempted. At a portion adjacent at least portion of the printed circuit board which is to be inserted in a connector on the side of the drive (or an region extending from the portion toward a fixing portion to be secured to the optical pick-up device), the wirings are formed together into one layer (single layer) in order to comply with movement of the optical pick-up device body relative to the connector on the side of the drive. In order to ensure flexibility, the area of the portion of the printed circuit board, for example, the area of the portion adjacent the portion to be inserted in the connector on the side of the drive is approximately doubles the area of the portion to be fixed to the optical pick-up device body. Therefore, when it is required to produce the printed circuit board in which a multi-layer wiring portion and a single-layer wiring portion are integrated with each other, a cost problem in which the yield of sth of the multi-layer writing portions is reduced arises.

Moreover, in the recent high-functionalized flexible substrate, the number of pins is considerably much and a distance between adjacent pins becomes a narrow pitch. Therefore, as compared to a precision in drill through-holes in the flexible substrate according to the technique described in the above-mentioned Patent Document 1, a precision in positioning of the narrow pitch portion is serious. As a result, there is also a problem that connecting yield is considerably reduced.

In the technique described in the above-mentioned Patent Document 2, the second flexible substrate includes parts on which components are arranged. Therefore, the second flexible substrate is produced in such a manner that the portion thereof to be inserted into the connector on the side of the drive and the portion on which the chip components are to be mounted are integrated with each other.

While the technique described in the above-mentioned Patent Document 3 is effective for an optical pick-up device having an allowance in thickness, it is not applicable to an optical pick-up device having a limited thickness, or so-called thin optical pick-up device, since the thickness limitation is serious and a connector can not be connected to the flexible substrate in the optical pick-up device.

The object of the present invention is to provide an optical disk drive apparatus which exhibits functions required for a high-performance optical pick-up device, so as to be capable of being thinned and regenerating and recording not only a CD but also a DVD meeting various standards, and which is provided with a flexible substrate that is manufactured at a low cost and with reliability.

In attain the above-mentioned object, there is provided an optical disk drive apparatus comprising an optical pick-up device body having at least a semiconductor chip component mounted thereon, an optical module having an optical system, a case for optical pick-up adapted to be reciprocally traveled linearly in a horizontal direction between an inner periphery and an outer periphery of an optical disk, the optical pick-up device and the optical module being provided at the case, and a flexible substrate (flexible printed-circuit board) to be inserted into a connector on the side of a drive (a connector at a drive side) wherein the flexible substrate is divided into a first flexible substrate that is fixed to an upper surface of the optical pick-up device body provided at the case for optical pick-up, and a second flexible substrate that is connected to the first flexible substrate at a region adjacent to (in the vicinity of) an end portion of the case for optical pick-up and extends toward the connector on the side of the drive. The above-mentioned drive is a unit in which a drive device for rotating the optical disk and a circuit for carrying out the transmitting-receiving of a signal between the optical pick-up device body and the circuit are provided. The position of the case for optical pick-up is changed relative to the drive. "The region adjacent to (in the vicinity of) the end portion of the case for optical pick-up at which the first flexible substrate and the second flexible substrate are connected" means, for example, "a region extending from an edge of the case for optical pick-up from which the second flexible substrate is led toward the connector on the side of the drive (the connector at the drive side) to the optical pick-up device body" and corresponds, for example, to "side wall of the case for optical pick-up which is opposed to the optical pick-up device" or "an upper portion of a bottom surface on which the optical pick-up device is arranged". Incidentally, the first flexible substrate is not fixed to an upper surface of the optical pick-up device but may be fixed to a lower surface or a side surface according to the position of the optical pick-up device body on the case for optical pick-up.

Electrical connection between the first flexible substrate and the second flexible substrate is made by overlapping "wiring conductors on a first connection end portion of the first flexible substrate" and "wiring conductors on a second connection end portion of the second flexible substrate" each other at the region adjacent to (in the vicinity of) an end portion of the case for optical pick-up (e.g. on the case for optical pick-up) and connected to one another through joining material. The opposite end of the second flexible substrate relative to the second connection end portion may be inserted into the connector on the side of the drive. A connection section in which the wiring conductors of the first connection end portion and the wiring conductors of the second connection end portion are connected to each other at the at the portions adjacent end portions thereof is pressed down by a cover attached to the optical pick-up case (for example, upper side) for protecting the optical pick-up device body, whereby connection strength between the wiring conductors can be ensured.

In a preferred embodiment, the thickness of the first flexible substrate (2-a) is greater than that of the second flexible substrate (2-b).

In a preferred embodiment, the number of layers of the wiring conductors on the first flexible substrate is greater than that of layers of the wiring conductors on the second flexible substrate (the first flexible substrate is configured with more layers than layer(s) configuring the second flexible substrate).

Moreover, the second flexible substrate is made of one-layer (single-layer) wiring conductors and the first flexible substrate is made of multi-layer wiring conductors.

Furthermore, connection surfaces of the connection conductors between the first and second connection end portions extend horizontally (for example, a surface extending along an upper or lower surface of the optical pick-up device body) and the cover is an upper cover.

Furthermore, the first connection end portion is bent toward a substantially vertical direction from the first flexible substrate, the second connection end portion is bent toward the substantially vertical direction from the second flexible substrate, connection surfaces of the connection conductors between the first and second connection end portions extend vertically, and the cover is a member which extends from a back cover and is bent toward the substantially vertical direction.

Moreover, the second flexible substrate is formed with a hole adjacent the second connection end portion, the hole being fitted over a circular- or rectangular-protruding portion formed at the case for optical pick-up.

Furthermore, the first flexible substrate is formed with a hole adjacent the first connection end portion and the second flexible substrate is formed with a hole adjacent the second connection end portion, the holes being fitted over circular-or rectangular-protruding portions formed at the case for optical pick-up.

Furthermore, the first and second flexible substrates are provided at the connection end portions with conductive layers beside the wiring conductors, the conductive layers being connected to each other by a joining material.

Moreover, a width of each of the wiring conductors on the first connection end portion and a width of each of the wiring conductors on the second connection end portion are made substantially uniform within a connection range forming the connection section.

Moreover, a width of each of the wiring conductors on the first connection end portion and a width of each of the wiring conductors on the second connection end portion are divided into several regions within a connection range forming the connection section, and the wiring conductors are each branched and formed uniformly.

Furthermore, the joining material is solder.

Moreover, the joining material is anisotropic-conductive-adhesives or anisotropic-conductive film.

Furthermore, the first flexible substrate is connected to a sub-flexible substrate to which the optical module is connected.

In accordance with the present invention, it is possible to realize an optical disk drive apparatus which exhibits functions required for a high-performance optical pick-up device, so as to be capable of being thinned and regenerating and recording not only a CD but also a DVD meeting various standards, and which is provided with a flexible substrate that is manufactured at a low cost and with reliability.

BRIEF DESCRIPTION OF THE DRAWINGS

These and other objects and many of the attendant advantages of the present invention will be readily appreciated as the same becomes better understood by reference to the following detailed description when considered in connection with the accompanying drawings, in which like reference numerals denote the same parts throughout the Figures and wherein.

DETAILED DESCRIPTION

A flexible substrate according to the present invention and an embodiment of an optical pick-up device utilizing the flexible substrate will be discussed hereinafter with reference to the accompanying drawings.

Figure 1A:
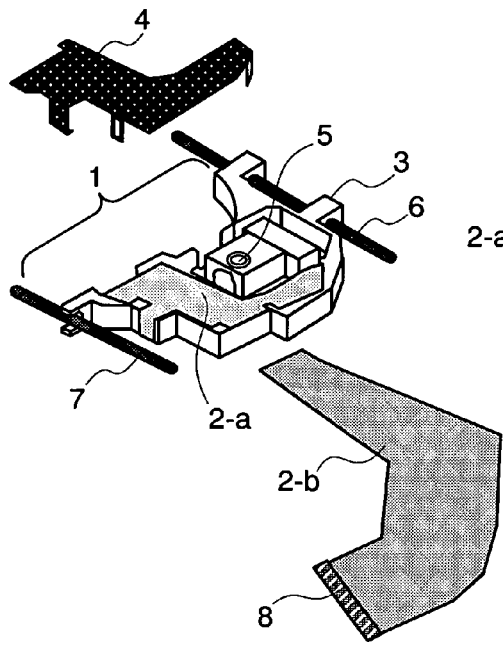
FIG. 1A is a schematic perspective view illustrating a condition where a flexible substrate according to the present invention in which high-densification of wirings is taken seriously, and a second flexible substrate in which flexibility is taken seriously are separated from each other at an end of a traveling direction of a case for optical pick-up.
Figure 1B:
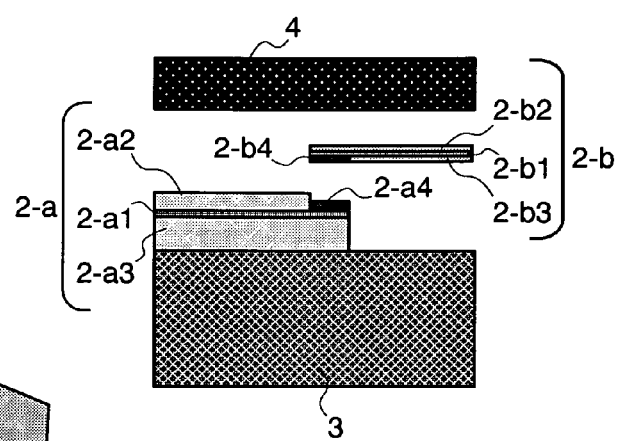
FIG. 1B is a schematic sectional view illustrating the condition of FIG. 1A.

FIGS. 1A and 1B are respectively a schematic perspective view and a schematic sectional view which illustrate a condition where a flexible substrate of the present invention that extends from an optical pick-up device body to a connector on the side of a drive is divided, at an end relative to a traveling direction of a case for an optical pick-up (a displacement direction relative to an optical disk (or drive)), into a first flexible substrate being fixed to the optical pick-up device body and having two or more-layers with emphasis on its high-density wirings, and a second flexible substrate of a single-layer with emphasis on its flexibility to be inserted into the connector on the side of the drive.

Figure 2A:
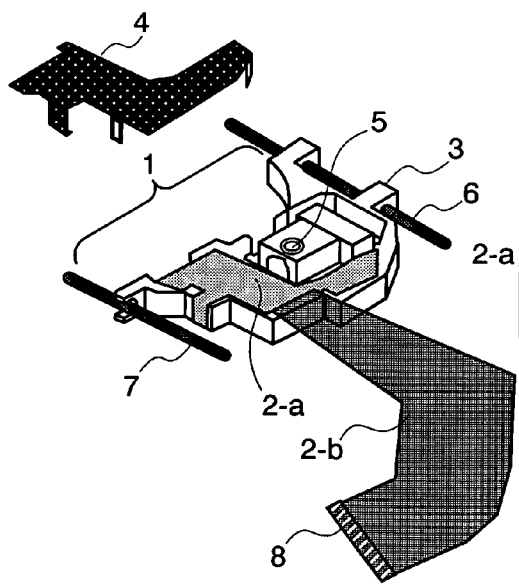
FIG. 2A is a schematic perspective view illustrating a condition where the first flexible substrate and the second flexible substrate are connected to each other at the end of the traveling direction of the case for optical pick-up.
Figure 2B:
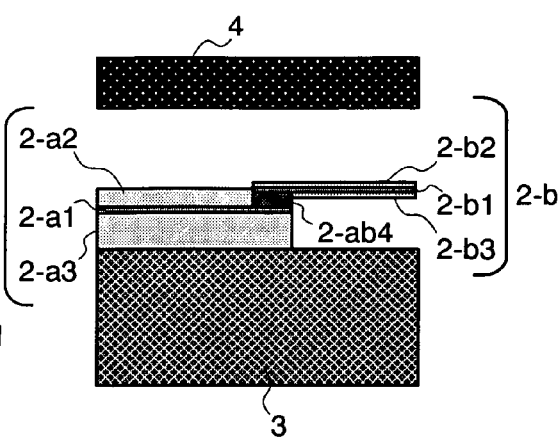
FIG. 2B is a schematic sectional view illustrating the condition of FIG. 2A.

FIGS. 2A and 2B are a schematic perspective view and a schematic sectional view each showing a condition where the divided first flexible substrate and second flexible substrate are connected to each other at an end portions of the case for optical pick-up in the traveling direction.

Figure 3A:
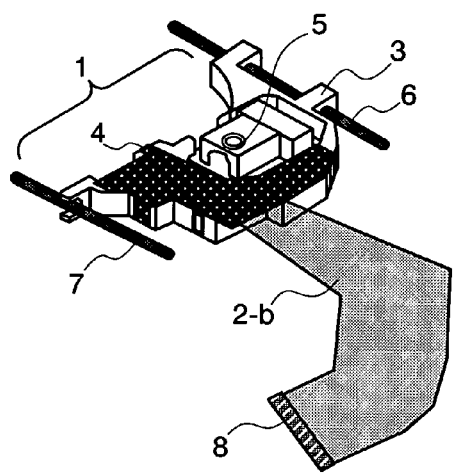
FIG. 3A is a schematic perspective view illustrating a condition where a connection sections is made as shown in FIGS. 2A and 2B is pressed down by a metallic cover for protecting an optical pick-up device body, and attached to the case for optical pick-up.
Figure 3B:
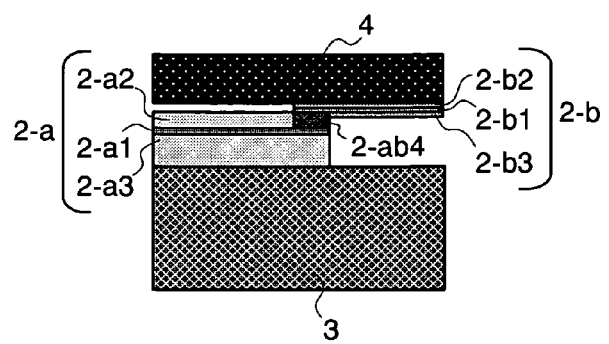
FIG. 3B is a schematic sectional view illustrating the condition of FIG. 3A.

FIGS. 3A and 3B are a schematic perspective view and a schematic sectional view each illustrating a condition where a connection section connected in a manner shown in FIGS. 2A and 2B is pressed against the case for optical pick-up by a metallic cover for protecting the optical pick-up device body and mounted to the case for optical pick-up.

Figure 4:
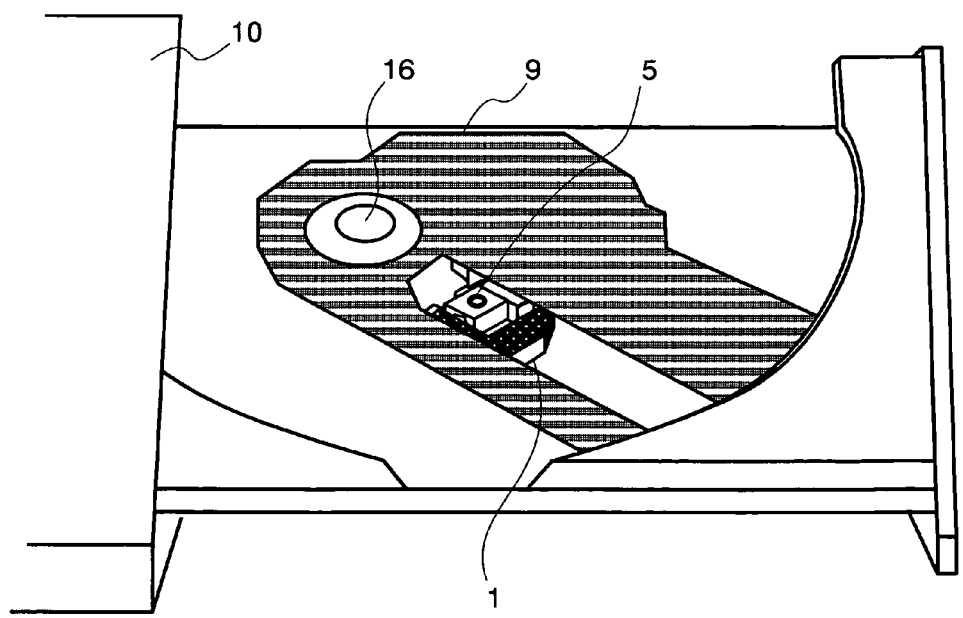
FIG. 4 is a schematic perspective view showing an optical disk drive in which an optical pick-up device according to the present invention is incorporated.

FIG. 4 is a schematic perspective view illustrating a condition where the optical pick-up device according to the present invention is incorporated in an optical disk drive apparatus. The optical disk drive apparatus 10 is comprised of the optical pick-up device body 1 (and a case carrying this) as illustrated in FIGS. 1A to 3B, and a unit provided with a drive device called "a drive" which rotates an optical disk (shown as a rotor 16 into which the optical disk is to be fitted) and/or a circuit for carrying out the transmitting-receiving of a signal between the optical pick-up device body and the circuit are provided. Incidentally, the illustration of the latter (the unit) is omitted in FIG. 4. The position of the optical pick-up device body 1 relative to the drive is adapted to be displaced along a groove of a cover 9 on the side of the drive shown in FIG. 4, so to speak, in a radial direction of the optical disk.

Figure 5A:
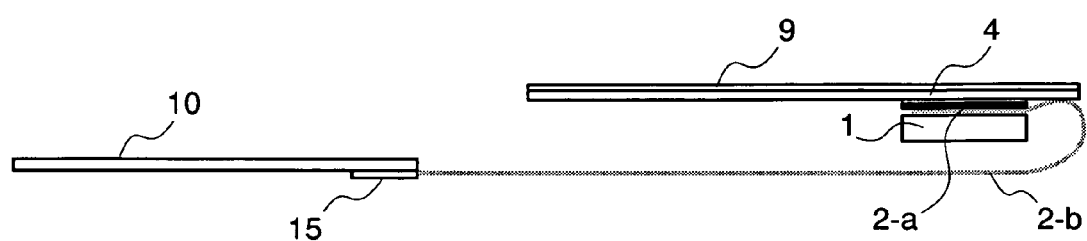
FIGS. 5A and 5B are each a schematic side elevational view showing the operation of a flexible substrate in the optical pick-up device according to the present invention.
Figure 5B:
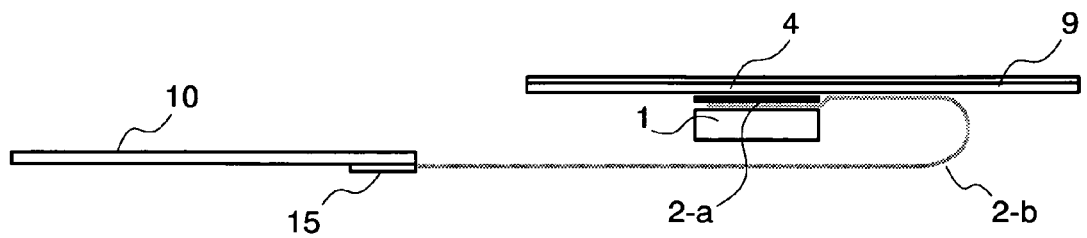

FIGS. 5A and 5B are each a schematic side view showing the operation of the flexible substrate in the optical pick-up device according to the present invention. More particularly, FIG. 5A shows a condition where the optical pick-up device is shifted to the outermost side of the optical disk (accesses an outermost track), and FIG. 5B shows a condition where the optical pick-up device is shifted to the innermost side of the optical disk (accesses an innermost peripheral track).

Meanwhile, a thin optical pick-up device (having a thickness of 7 mm or less) which is used for regeneration and recording of an optical disk such as a CD, a DVD or the like, or the optical disk drive apparatus 10 having the thin optical pick-up device incorporated therein is such constructed as shown in FIGS. 1A to 4. Namely, the optical pick-up device is comprised of: "a case 3 for optical pick-up" which is made mainly from any material selected from the group consisting of Zn (zinc), Al (aluminum), Mg (magnesium) and PPS (Poly Phenylene Sulfide) resin, etc., by a die casting process or molding and is driven by a primary axis side shaft 6 and reciprocally traveled linearly between an inner side (an inner periphery) and an outer periphery side (an inner periphery) of the optical disk along a secondary axis side shaft 7; "the optical pick-up device body 1" on which an LSI semiconductor chip component for carrying out signal processing of information read out from the optical disk, signal processing of information to be written in the optical disk, and the like is mounted; and "a light emitting element, various lens, a mirror, a photodetector device and the like" as components constituting an optical system. Moreover, an additional flexible substrate to which an optical module such as the light emitting element, the photodetector device, or the like, or the LSI semiconductor chip component is connected may be employed as a sub-flexible substrate.

Moreover, as shown in FIGS. 1A and 1B, the flexible substrate extending from the optical pick-up device to a connector insertion portion 8 on the side of the drive is manufactured in the condition that the flexible substrate is divided into a first flexible substrate (2-*a*) being fixed to the optical pick-up device body and having two or more-layers (multi-layer) with emphasis on its high-density wirings and a second flexible substrate of a single-layer with emphasis on its flexibility to be inserted into the connector on the side of the drive, at the end of the case 3 for optical pick-up in its traveling direction. For example, the first flexible substrate (2-*a*) is configured as a laminated structure which is comprised of a plurality of conductive layers and at least one nonconductive layer electrically insulating the conductive layers, the conductive layers and the nonconductive layer being laminated with one another, and the second flexible substrate (2-*b*) is configured as a laminated structure which is comprised of at least one conductive layer and at least one nonconductive layer serving as a substrate for the at least one conductive layer, which are laminated with each other.

Since the first flexible substrate (2-*a*) is made into multiple layers with emphasis on its high-density wirings, the first flexible substrate (2-*a*) can be manufactured, for example, according to the following procedure. A plurality of the 1st layers of the several conductive layers (wiring patterns) constituting the first flexible substrate (2-*a*) are arranged and printed on a main surface of a first nonconductive sheet. A plurality of the 2nd layers of the several conductive layers (wiring patterns) constituting the first flexible substrate (2-*a*) are arranged and printed on a main surface of a second nonconductive sheet. In this way, according to the number of the conductive layers constituting the first flexible substrate (2-*a*), a plurality of the nonconductive sheets, on several portions of which the wiring patterns are respectively printed are prepared. A sheet-like, laminated structure that serves, so to speak, as a mother member, is made by causing the plurality of the nonconductive sheets to overlap one another while causing the respective wiring patterns to be positionally aligned with (positioned with respect to) one another. It should be noted that the mother member having such a laminated structure is also a kind of flexible substrate. On a main surface of the mother member (sheet-like flexible substrate) formed in this way, a plurality of wiring patters that correspond to the number of the first flexible substrates (2-*a*) are continuously arranged.

The procedure for manufacturing the first flexible substrates is not limited to the above mentioned procedure. If such a mother member (a sheet-like flexible substrate) is previously made, the first flexible substrates can be easily obtained with high-yield of sth by simply causing the wiring patterns adjacent to one another on the main surface of the mother member to be separated. Concretely, first flexible substrates can be made by cutting out (punching) portions of the main surface of the mother member formed into a sheet-form. By so doing, it is possible to considerably increase the number of sth of the first multi-layer flexible substrates, which are to be connected to the optical pick-up device body 1, to be taken from limited material. This can considerably contribute to cost reduction.

Respective ends of the first flexible substrate (2-*a*) and the second flexible substrate (2-*b*) which are manufactured in the divided condition (separately) as described above are connected to each other at an end of the case for optical pick-up in its travel direction with the respective conductors (of the first and second substrates) overlapping with one another in parallel conditions. At this time, a slight deviation in angle (drift from the parallel condition) may be produced between an extending direction of a conductor formed on the end of the first flexible substrate (2-*a*) and an extending direction of a conductor formed on the end of the second flexible substrate (2-*b*). However, such a slight deviation in angle is allowed, inasmuch as electrical short does not accidentally occur between adjacent conductors. Moreover, as shown in FIGS. 3A and 3B, the metallic cover 4 for protecting the optical pick-up device body 1 is attached to the case 3 for optical pick-up in a condition where the metallic cover 4 holds down the end of the first flexible substrate (2-*a*) and the end of the second flexible substrate (2-*b*), that is, holds down the respective connections.

More particularly, the second flexible substrate (2-*b*) to be inserted into the connector on the side of the drive and flexibility of which gains recognition (for example, by reducing stiffness of the second flexible substrate) in comparison with the first flexible substrate, is such arranged that the connection section thereof is held down (pressed) against the connection section (connection end) of the first flexible substrate (2-*a*) fixed to the optical pick-up device body at an end of the case 3 for optical pick-up in its traveling direction by the metallic cover 4, in a condition where the wiring conductors of the first and second flexible substrates (2-*a*, 2-*b*) overlap with one another in parallel, are aligned with one another, and are connected to one another by joining material. As shown in FIGS. 5A and 5B, the construction in which the connection section of the first flexible substrate (2-*a*) and the connection section of the second flexible substrate (2-*b*) are held down (pressed) by the metallic cover 4 in this way, can prevent disconnection of the connection section (2-*ab*4) between the first flexible substrate (2-*a*) and the second flexible substrate (2-*b*) even if any load (for example, a weak tensile stress applied to the second flexible substrate (2-*b*)) is repeatedly applied to when the case 3 for optical pick-up is traveled toward the inner peripheral side or outer peripheral side of the optical disk.

Incidentally, the first flexible substrate (2-*a*) and the second flexible substrate (2-*b*) which are divided are each formed into a sheet-form in which the wiring conductor sections (2-*a*1), (2-*b*1) made from copper foils or the like are interposed between insulating materials (2-*a*2), (2-*a*3), (2-*b*2), (2-*b*3) which are formed of resinous material including polyimide resin or adhesives. Incidentally, in FIGS. 1B, 2B and 3B, the connection end section between the first flexible substrate (2-*a*) and the second flexible substrate (2-*b*) is shown.

Multi wiring layers (multi-layer sections are not shown in these Figures) which are to be connected to the LSI semiconductor chip component and the like are formed in the interior of the first flexible substrate (2-*a*).

The connection technique of the present invention for connecting the first flexible substrate (multi-layer structure) and the second flexible substrate (single-layer structure) is applicable mainly to the thin optical pick-up device.

First Embodiment

Now, a method for making connection between the first flexible substrate (2-*a*) and the second flexible substrate (2-*b*) according to a first embodiment of the present invention will be discussed hereinafter with reference to FIGS. 1A to 6.

Figure 6:
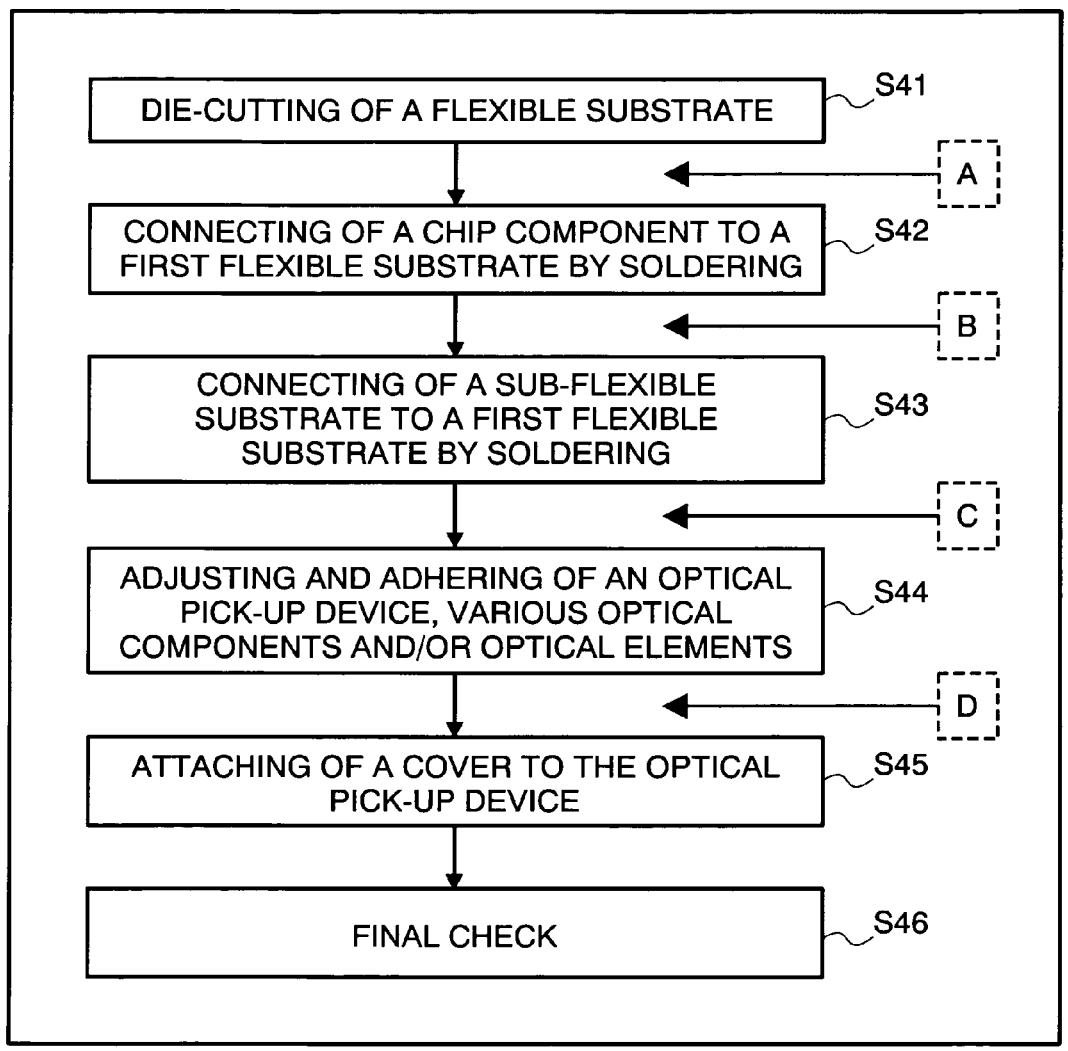
FIG. 6 is a flowchart exhibiting a procedure for producing the optical pick-up device according to the present invention.

FIG. 6 is a flow chart schematically exhibiting a procedure for manufacturing the optical pick-up device according to the present invention.

The method for manufacturing the optical pick-up device comprises the steps of die-cutting flexible substrates from the mother member that is supplied in a sheet-form (S41), thereafter mounting the LSI chip component onto the first flexible substrate (2-*a*), which is to be finally secured to the optical pick-up device body 1, by fixing the LSI chip component onto the first flexible substrate (2-*a*) via solder material such as solder paste and causing the LSI chip component to be electrically connected to the first flexible substrate by reflowing the solder material (S42), thereafter causing a sub-flexible substrate having a light emitting element and a photodetector connected thereto to be connected, by soldering, to the first flexible substrate (2-*a*) which is to be finally fixed to the optical pick-up device body (S43), adjusting and adhering various optical components and/or optical elements (44), causing the second flexible substrate (2-*b*) to be connected to the first flexible substrate (2-*a*) mainly at any of stages A-D shown in FIG. 6, thereafter carrying out attaching of the metallic cover for protecting the optical pick-up device body 1 (S45), and thereafter carrying out final check (S46).

It is conceivable that the step for making connection between the first flexible substrate (2-*a*) and the second flexible substrate (2-*b*) may be carried out mainly at the stages A-D shown in FIG. 6. That is, making connection between the first flexible substrate (2-*a*) and the second flexible substrate (2-*b*) is carried out after the step (S41) at the stage A, after the step (S42) at the stage B, after the step (S43) at the stage C, and after the step (S44) at the stage D. In the case where making the connection is carried out at the step D which is a final step of assembling of the optical pick-up device, faults in a visual appearance of the second flexible substrate which may be produced in the course of the assembling of the optical pick-up device can be considerably reduced, so that it is possible to considerably increase the yield of the entire optical pick-up device.

While making connection between the first flexible substrate and the second flexible substrate may be carried out at any of the stages A, B, C, D as discussed above, the case where making connection between the first flexible substrate and the second flexible substrate is carried out at the stage D will be discussed hereinafter with reference to FIGS. 1A to 6 and 12.

First of all, the first flexible substrate (2-*a*) connected to the optical pick-up device body is arranged on the side of the objective lens 5 on the case 3 for optical pick-up as shown in FIGS. 1A and 2A. The first flexible substrate (2-*a*) is shown in a condition after a step (S44) for adjusting the light emitting element, photodetector and various optical components of the optical pick-up device is carried out in a condition where the first flexible substrate (2-*a*) is subjected to electrical testing. The method for testing may be carried out utilizing a probe pin or a connector.

Next, positioning or registering of the second flexible substrate (2-*b*) with respect to the first flexible substrate (2-*a*) is carried out as shown in FIGS. 1B and 2B, and applying heat to the connection section (2-*ab*4) between the first flexible substrate and the second flexible substrate is carried out while applying a tool heater (not shown) onto an upper surface of the end of the second flexible substrate in the condition shown in FIG. 2B and locally pressing the connection section (2-*ab*4). Thus, the end of the first flexible substrate (2-*a*) and the end of the second flexible substrate (2-*b*) which overlap each other in a height direction of the optical pick-up device (in a vertical direction) are connected to each other through solder, an anisotropic conducting sheet or adhesives. The positioning of the end of the second flexible substrate (2-*b*) with respect to the end of the first flexible substrate (2-*a*) is carried out, for example, on the basis of an image signal obtained by magnifying and picking up images of pitch portions of the conductors (2-*a*1, 2-*b*1) respectively formed on the ends of the first and second flexible substrates as shown in FIGS. 12A and 12B, by a CCD camera (not shown) or the like which is arranged above the second flexible substrate (2-*b*).

It is desirable that the positioning of the end of the second flexible substrate (2-*b*) with respect to the end of the first flexible substrate (2-*a*) is accurately carried out in such a manner that a center line in a width direction of a portion of the second flexible substrate (2-*b*) that is curved as especially shown in FIGS. 5A and 5B (the portion of the second flexible substrate is adjacent the optical pick-up device body 1) is directed to the traveling direction of the case 3 for optical pick-up. The portion of the second flexible substrate (2-*b*) is led from the above-mentioned connection section (2-*ab*4) to the traveling direction and folded back toward the connector on the side of the drive (to which the connector insertion section 8 is connected) according to the position of the case 3 for optical pick-up. An angular deviation θz of the above-mentioned center line (extending in a direction in which the portion of the second flexible substrate extends) relative to the traveling direction on a main surface of the portion of the second flexible substrate (2-*b*) is not produced, so that a deviating force is not applied to the second flexible substrate (2-*b*) at the time when the case 3 for optical pick-up is traveled.

Figure 12A:
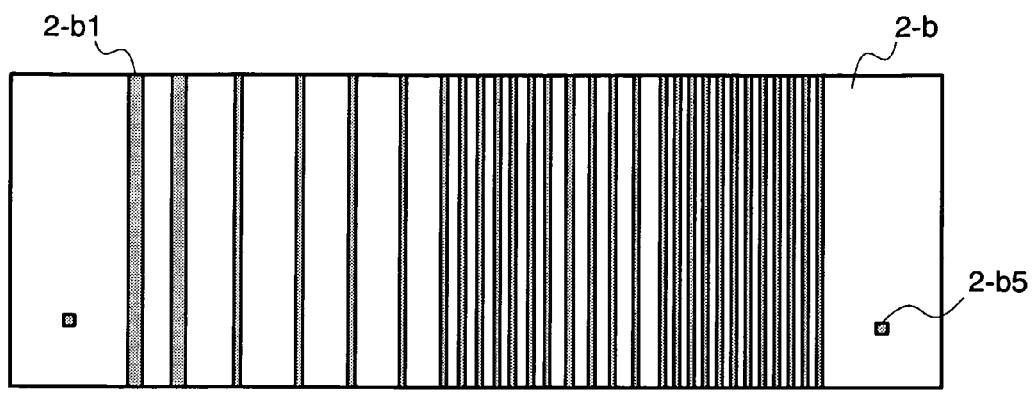
FIG. 12A is a schematic view that shows a connection end of the second flexible substrate and is of assistance in explaining a positioning structure for facilitating connection of the first flexible substrate and the second flexible substrate according to the present invention.
Figure 12B:
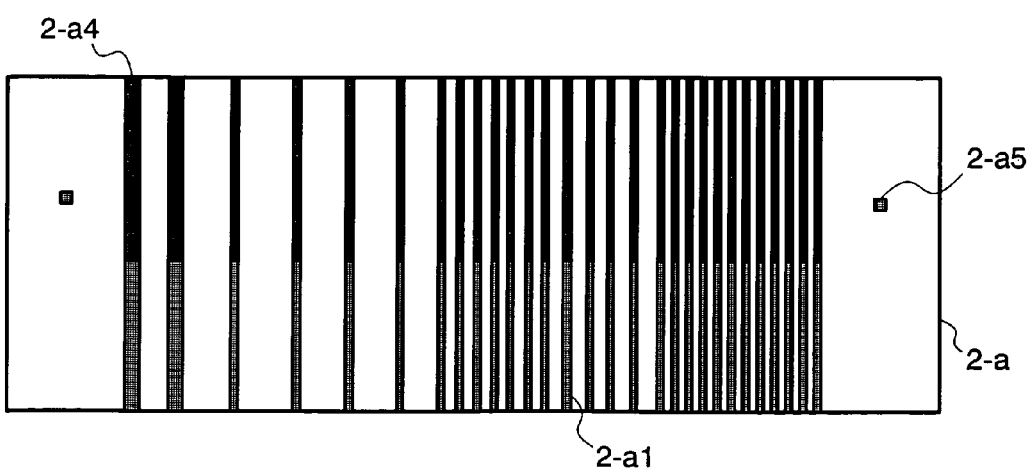
FIG. 12B is a schematic view that shows a connection end of the first flexible substrate and is of assistance in explaining the positioning structure.

In order to facilitate the positioning of the end of the second flexible substrate (2-*b*) with respect to the end of the first flexible substrate (2-*a*), positioning marks (alignment marks) (2-*a*5) and (2-*b*5) which are of the same size and rectangular or circular may be respectively formed (printed) on the first flexible substrate (2-*a*) and the second flexible substrate (2-*b*) as shown in FIGS. 12A and 12B. It is favorable that the connection between the end of the first substrate (2-*a*) and the end of the second flexible substrate (2-*b*) is made while observing these positioning marks (2-*a*5) and (2-*b*5) by the CCD camera arranged as described above or a microscope (not shown) and ascertaining that the positioning marks (2-*b*5) are superposed on the other positioning marks (2-*a*5). Incidentally, the size of the positioning marks of the second flexible substrate maybe smaller *than that of the positioning marks of the first flexible substrate. This construction can allow lower positioning marks to be observed through the positioning marks superposed on the lower positioning marks, thus finding the degree of a positional deviation between the first and second flexible substrates, and is, therefore, preferable.

Next, the metallic cover 4 is put on the overlapped flexible substrates from the side of the objective lens 5 as shown in FIGS. 3A and 3B. Thus, the steps relating to the connecting of the flexible substrates (2-a, 2-b) are finished. In this way, the connection section between the first flexible substrate (2-a) and the second flexible substrate (2-b) is held down by the metallic cover 4, whereby the connection section can be prevented from being disconnected even if load is repeatedly applied to the connection sections at the time when the case 3 for optical pick-up is traveled as shown in FIGS. 5A and 5B.

Regarding the second flexible substrate (2-b), flexibility is taken seriously. It is necessary for the optical pick-up device to endure millions of accesses (accesses repeated several million times). In the case where a flexible substrate (2-b) has a length of 10 mm. and a width of 9 mm. is employed as the second flexible substrate, it is desirable that rigidity of the second flexible substrate (2-b) is designed such that an elastic force is produced, for example, in the case where the second flexible substrate is bent radially by 2 mm. becomes $2.0 \times 10^{-2}$ N or more. Incidentally, in order to cause the rigidity of the second flexible substrate (2-b) to be lower than that of the first flexible substrate (2-a), the thickness of the second flexible substrate (2-b) may be thinner than that of the first flexible substrate (2-a). In this case, it is desirable that the thickness of the second flexible substrate (2-b) is 40 μm or more. In the case where the thickness of the second flexible substrate (2-b) is less than the above value, the wiring parts are easy to disconnect. In addition, since the rigidity of the second flexible substrate is too low, the second flexible substrate (2-b) can not resist to the held-down by the cover 9 on the side of the drive and is bent and damaged, and a problem that damages are resultantly progressed may arise. Moreover, in the case where the second flexible substrate (2-b) is made up of one layer allowing the sufficient number of wirings to be formed thereon, the second flexible substrate (2-b) remains to be one layer and the first flexible substrate (2-a) may be cemented into two or more layers, in order to cause the rigidity of the second flexible substrate (2-b) to be lower than that of the first flexible substrate (2-a).

As the joining material, there may be employed solder plating, solder paste or the like. In the case where solder paste is used for connecting of the LSI chip component and solder plating (2-a4), (2-b4) is used for making connection between the flexible substrates, it is desirable that temperature hierarchy is set up in such a manner that the melting point of the solder plating (2-a4), (2-b4) is set at a level higher than that of the solder paste. In this case, only the solder for the connection section (2-ab4) between the flexible substrates may be melted by local heating, so that it is possible to repair. Incidentally, the joining material is not limited to the solder plating and the solder paste. Other solder materials that are supplied in a different supply manner, anisotropic-conductive-adhesives, anisotropic-conductive films and the like may be employed as long as they can ensure the connection.

Moreover, the above-mentioned portions (2-a2), (2-a3), (2-b2) and (2-b3) of the flexible substrates are made of resins including polyimide resin, and acrylic or epoxy adhesives in which mainly wiring conductors are inserted. However, regions that do not have adhesives may be present in the portions. In the case where a multi-layer flexible substrate is employed, wiring conductors such as copper foil may be included in the portions. It should be noted that if the wiring conductors (2-a1), (2-b1) are respectively regarded as "conductive layers", at least one of the portions (2-a2, 2-a3) and (2-b2, 2-b3) should be regarded as "a nonconductive layer". Moreover, in the case where a wiring conductor that is different from the wiring conductor (2-a1) is buried the portion (2-a3) of the first flexible substrate (2-a), a region of the portion (2-a3) serves as a nonconductive layer that cause these wiring conductors (conductive layers) to be electrically insulated from one another.

Figure 7:
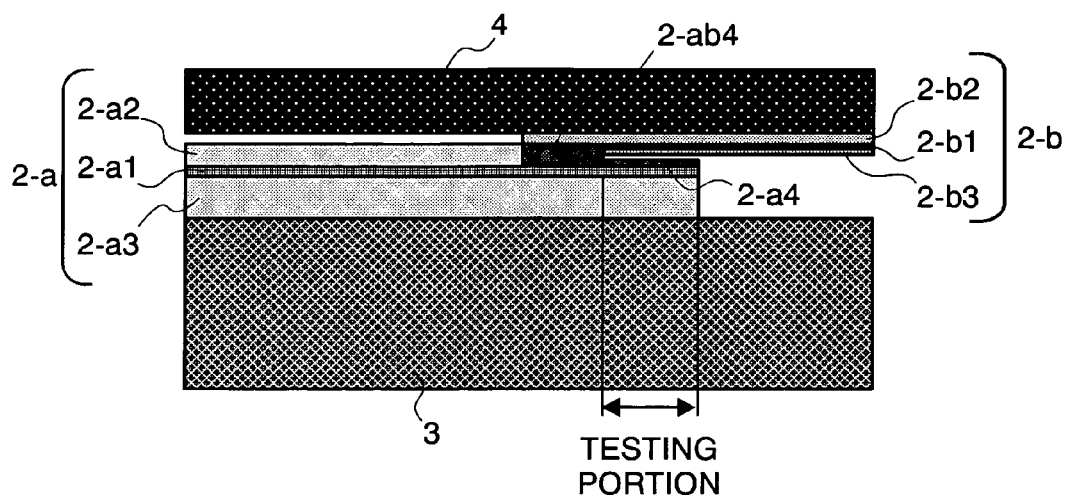
FIG. 7 is a schematic view illustrating a condition after connection between the first and second flexible substrates is made at a stage D of the procedure shown in FIG. 6, which is easy to be subjected to testing.

In the case where the first flexible substrate and the second flexible substrate are connected to each other at the above-mentioned stage D, when the light emitting element, the photodetector and the optical components are adjusted, the first flexible substrate (2-a) must be subjected to testing. For this reason, it is effective that the solder plating (2-b4) of the second flexible substrate (2-b) is thickened and a testing portion (2-a4) is formed separately from the connection portion (2-ab4) so as to have a thickness of 100 μm or more, as shown in FIG. 7 illustrating a condition after the first flexible substrate and the second flexible substrate are connected to each other.

Second Embodiment

Figure 8:
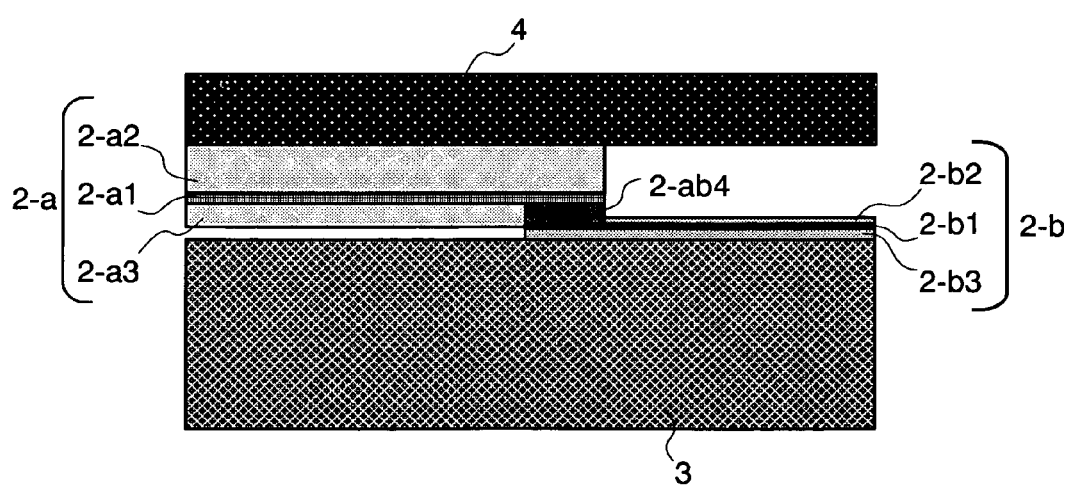
FIG. 8 is a schematic view which is of assistance in explaining a method for making connection between the first flexible substrata and the second flexible substrate according to a second embodiment of the present invention.

Referring now to FIG. 8, a method for making connection between the first flexible substrate (2-a) and the second flexible substrate (2-b) according to a second embodiment of the present invention will be discussed hereinafter. FIG. 8 is a schematic view illustrating the method according to the second embodiment of the present invention. The second embodiment is different from the first embodiment in that the first flexible substrate (2-a) and the second flexible substrate (2-b) are connected to each other vice versa in the height direction of the optical pick-up device and the first flexible substrate (2-a) is secured by the metallic cover 4 fixedly mounted to the case 3 for optical pick-up. Incidentally, in the case where the LSI chip component is not mounted on the side of the metallic cover 4 but is mounted on the side of the case 3 for optical pick-up, if making connection between the first flexible substrate and the second flexible substrate is carried out by using the solder plating applied onto the same surface of the flexible substrate on which the LSI chip component is mounted, solder plating may be applied to only one surface of the flexible substrate. Therefore, the above construction can contribute to cost reduction.

Third Embodiment

Figure 9:
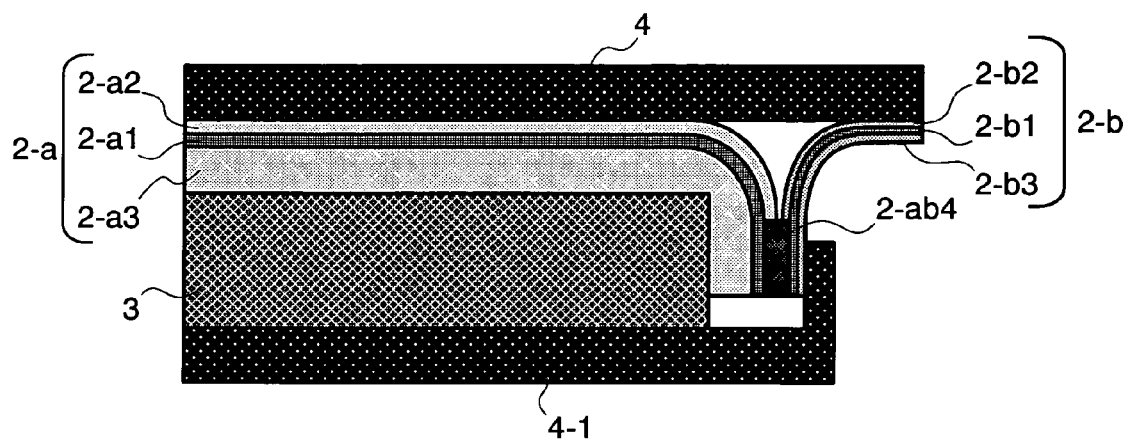
FIG. 9 is a schematic view which is of assistance in explaining a method for making connection between the first flexible substrata and the second flexible substrate according to a third embodiment of the present invention.

Referring to FIG. 9, a method for making connection between the first flexible substrate (2-a) and the second flexible substrate (2-b) according to a third embodiment of the present invention will be discussed hereinafter. FIG. 9 is a schematic view illustrating the third embodiment. The third embodiment is different from the first and second embodiments in that connection end portions of the first and second flexible substrates are bent in the height direction of the optical pick-up device (in the vertical direction), superposed in a horizontal direction and connected to each other, and held by a vertical portion of a metallic under cover (4-1) attached to the back of the case 3 for optical pick-up. This construction is effective in the case where a height limitation is seriously required. Incidentally, in the third embodiment, the connection end portion of the first flexible substrate may be connected to the connection end portion of the second flexible substrate by applying the connection end portion of the first flexible substrate onto the case 3 for optical pick-up while causing the connection end portion of the first flexible substrate to remain bent. Furthermore, the connection end portions of the first and second flexible substrates are vertically superposed in the height direction of the optical pick-up device and then connected to each other, and thereafter the connection end portions may be bent and held by the under cover (4-1).

Fourth Embodiment

Figure 10:
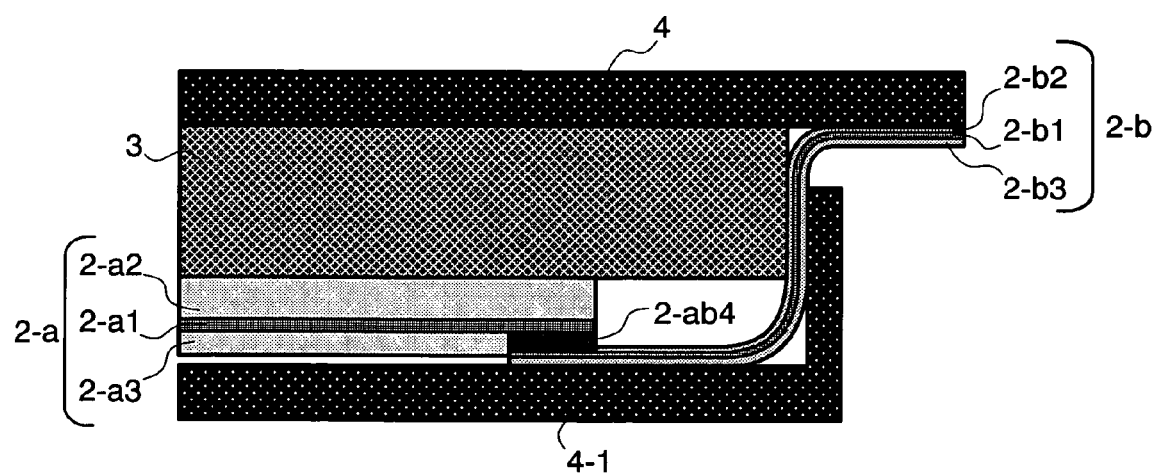
FIG. 10 is a schematic view which is of assistance in explaining a method for making connection between the first flexible substrata and the second flexible substrate according to a fourth embodiment of the present invention.

Referring to FIG. 10, a method for making connection between the first flexible substrate (2-a) and the second flexible substrate (2-b) according to a fourth embodiment of the present invention will be discussed hereinafter. FIG. 10 is a schematic view illustrating the fourth embodiment. The fourth embodiment is different from the third, second and third embodiments in that the connection section (2-ab4) between the first flexible substrate (2-a) and the second flexible substrate (2-b) is provided on the opposite side of the case 3 for optical pick-up relative to the objective lens 5. The construction according to the fourth embodiment is effective in the case where the first flexible substrate (2-a) can not be arranged on the side of the objective lens from the standpoint of design of the optical pick-up device 1. In the fourth embodiment, the connection section (2-ab4) is pressed down by the undercover (4-1). The cover 4 covers the upper surface of the case 3 for optical pick-up on the side of the objective lens 5, whereas the under cover (4-1) covers the opposite side of the upper surface of the case 3 for optical pick-up (the lower surface of the case 3 for optical pick-up).

Fifth Embodiment

Figure 11:
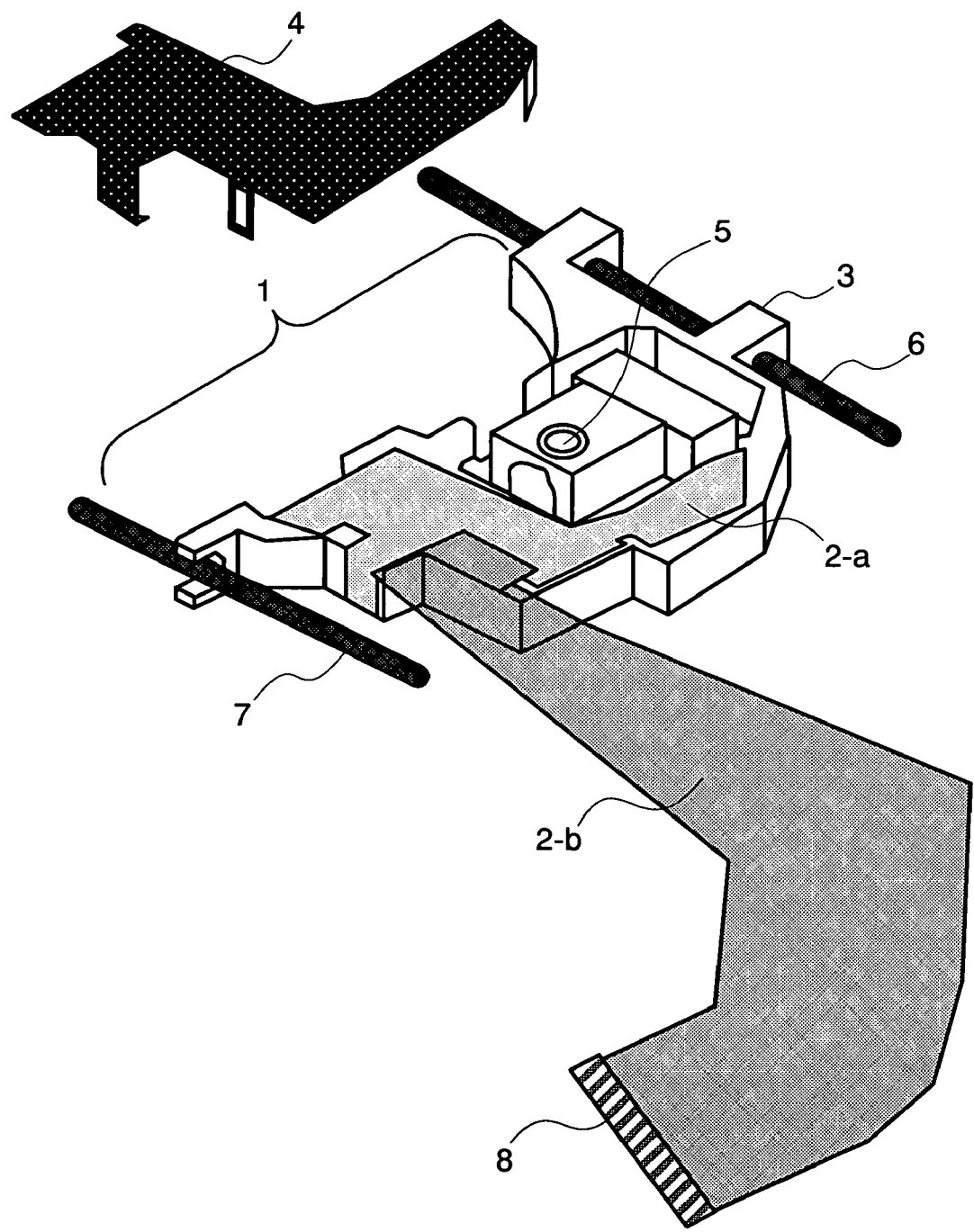
FIG. 11 is a schematic view which is of assistance in explaining a method for making connection between the first flexible substrata and the second flexible substrate according to a fifth embodiment of the present invention.

Referring to FIG. 11, a method for making connection between the first flexible substrate (2-a) and the second flexible substrate (2-b) according to a fifth embodiment of the present invention will be discussed hereinafter. FIG. 11 is a schematic view illustrating the fifth embodiment. The fifth embodiment is different from the first, second, third and fourth embodiments in that an end portion of the first flexible substrate on the case 3 for optical pick-up and a rectangular piece of the second flexible substrate (2-b), which projects toward the shaft 6 on the side of the primary axis of the second flexible substrate (2-b), are connected to each other. This construction may be employed according to the arrangement of the components on the optical pick-up device. Incidentally, while the connection section is arranged adjacent the secondary axis side shaft 7 on the case 3 for optical pick-up in the embodiment of FIG. 11, but the first and second flexible substrates may be connected to each other at a location adjacent to the primary axis side shaft 6.

Sixth Embodiment

The optical pick-up device 1 is required to endure millions of accesses. Therefore, it is desirable that the connection section is designed so as to be hard to be subjected to stress in addition to local holding-down of the connection section by the metallic cover 4 as shown in FIG. 3. Now, a structure according to a sixth embodiment of the present invention in which the connection section is designed so as to be hard to be subjected to stress will be discussed hereinafter.

Figure 13A:
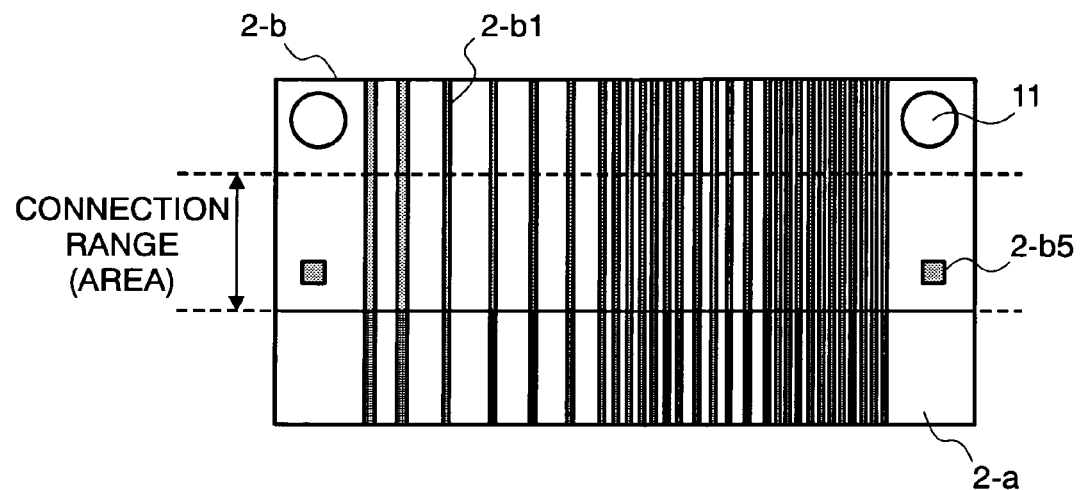
FIGS. 13A and 13B are schematic views a method for reducing stress applied to a connection sections, according to a sixth embodiment of the present invention.
Figure 13B:
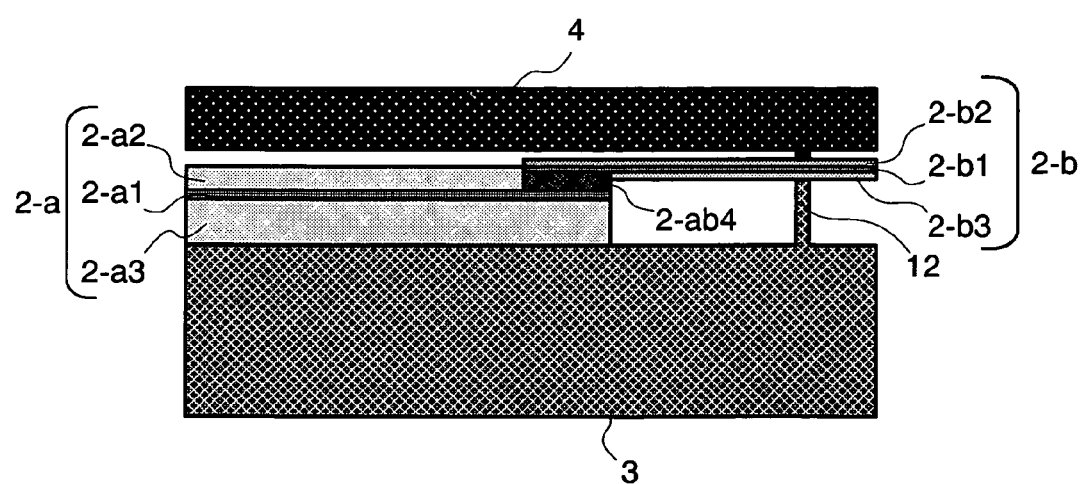

Referring now to FIGS. 13A and 13B, the structure according to the sixth embodiment will be discussed hereinafter. FIG. 13A and FIG. 13B show a schematic top plan view of the structure and a schematic sectional view of the structure, respectively. In this structure, through-holes 11 are formed in portions of the second flexible substrate (2-b) except (e.g. outside) a connection range (connection area) thereof, and circular or rectangular projection-shaped (bar-shaped) guide pins 12 which are fixed to the case 3 for optical pick-up are inserted through the through-holes 11. In the case where the end portions of the two flexible substrates (2-a, 2-b) are connected to each other through the conductors of narrow pitches (wirings 2-a1, 2-b1), precision in forming of the through-holes is inferior to precision in positioning of the end portions of the first and second flexible substrates. Therefore, looseness is produced between the through-holes 11 and the guide pins 12. However, such looseness (mechanical allowance/play) can allow stress which is applied to the connection section by moving of the flexible substrate 2 at the time of accessing of the flexible substrate 2, to be relieved. In addition to the forming of the through-holes 11 in the second flexible substrate (2-b), through which the guide pins 12 are inserted, through-holes through which the guide pins are also inserted may be formed in the first flexible substrate (2-a). In this case, the through-holes 11 can be utilized as simple positioning references (simplified alignment marks). If a combination of the through-holes 11 and the positioning marks (2-a5), (2-b5) shown in FIGS. 12A and 12B is used, the combination allows the operating performance to be considerably improved and is effective.

Incidentally, it is desirable that a plurality of the through-holes 11 through which the projection-shaped guide pins 12 are inserted are provided. If the through-holes are formed in the connection range and the region in which the first flexible substrate (2-a) and the second flexible substrate (2-b) overlap with each other, in addition to the region except the connection range, such a construction is also effective. Moreover, the flexible substrate 2 may be fixed onto the case 3 for optical pick-up by causing screws or the like to be inserted through the through-hoes 11 without allowing warping of the flexible substrate 2 to occur.

Figure 14A:
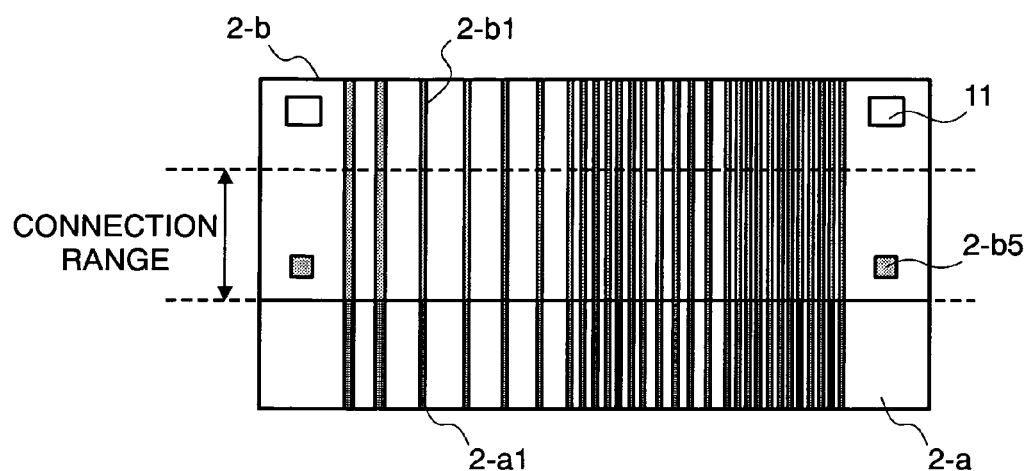
FIGS. 14A and 14B are schematic views illustrating an embodiment of the present invention that is different from the embodiment of FIGS. 13A and 13B and facilitates further reducing of the stress of the connection sections.
Figure 14B:
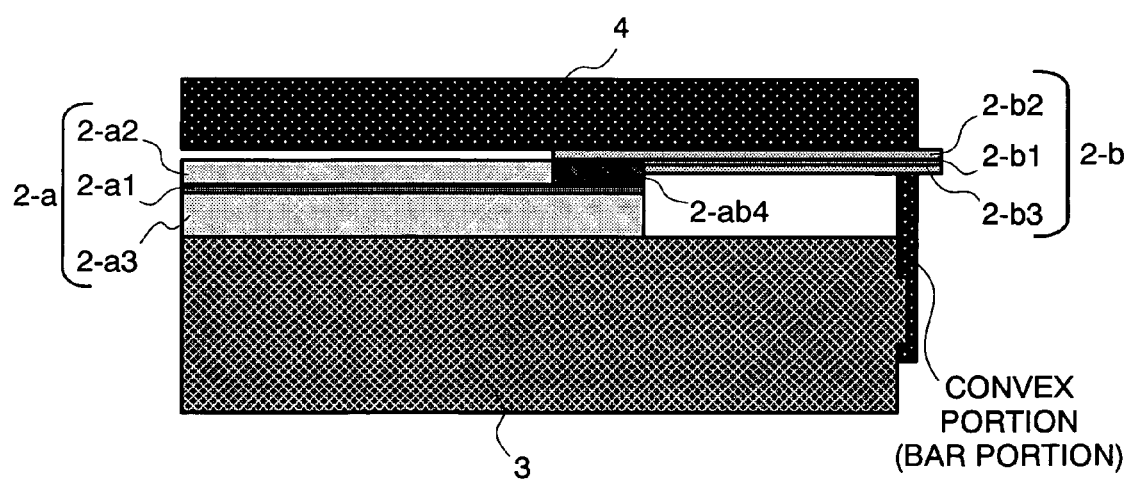

Next, a structure shown in FIGS. 14A and 14B will be discussed hereinafter. FIGS. 14A and 14B show a schematic top plan view of the structure and a schematic sectional view of the structure, respectively. In the structure shown in FIGS. 14A and 14B, a convex portion (bar-shaped portion) is provided on the side of the cover 4 and preferably fitted in and fixed to the case 3 for optical pick-up (for example, the side wall of the case 3). Alternatively, the protruding portion of the cover 4 may be bonded and fixed to the case 3 for optical pick-up by adhesives or the like.

Seventh Embodiment

Figure 15:
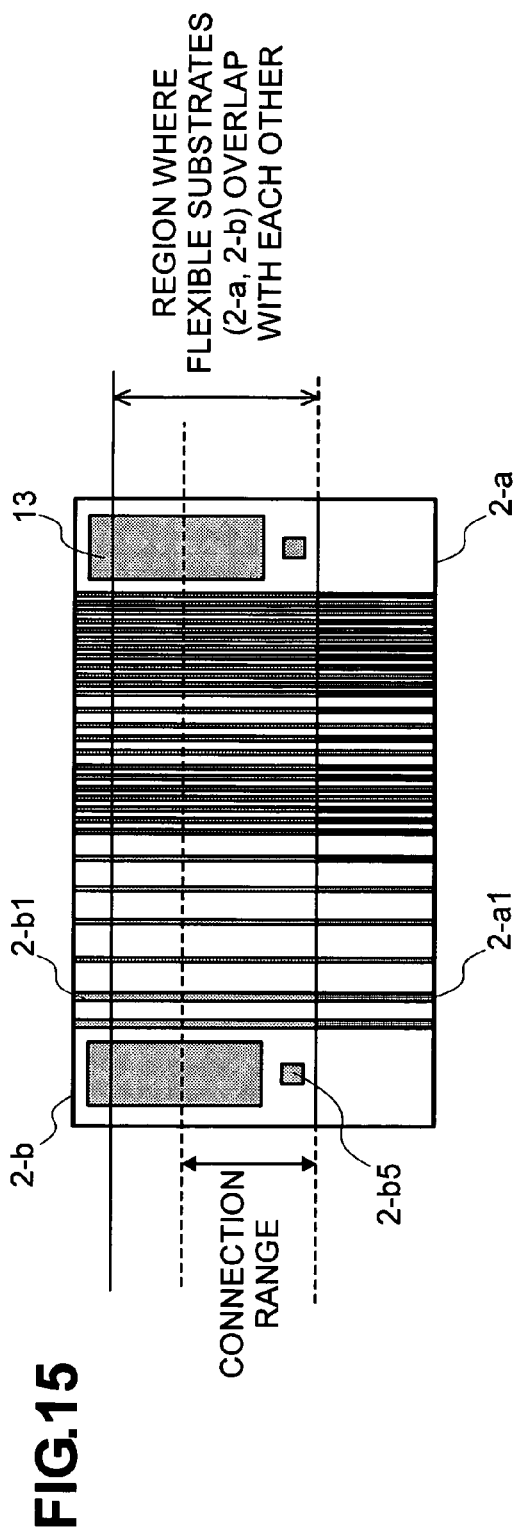
FIG. 15 is a schematic view illustrating a seventh embodiment of the present invention for facilitating further reducing of the stress of the connection sections.

Next, a structure shown in FIG. 15 will be discussed hereinafter. In the structure shown in FIG. 15, stress applied to the flexible substrate can be reduced by providing a connection pad 13 which extends from an electrical connection range between the first flexible substrate (2-a) and the second flexible substrate (2-b) to a region except the electrical connection range and causing the connection pad 13 to be connected to the first and second flexible substrates. Furthermore, the structure can allow initial connection strength to be increased. Incidentally, the connection pad 13 may be formed of metal material including copper foil on which wirings are to be formed. This allows the forming cost to be reduced and is therefore effective. Furthermore, in the case where the connection pad 13 is secured by using adhesives and an adhesive tape as a joining material, the case where metals are connected to each other can ensure a good connection as compared to the case where polyimide resins are connected to each other, and can increase strength. Moreover, the connection pad 13 may be connected by solder paste or solder plating. In the case where electrolytic solder plating is employed, a portion which allows electric current to flow, like the wirings, may be provided at the connection pad 13 in order that the connection pad 13 can be energized. Furthermore, the purpose of the connection pad 13 is to obtain an area, and the connection pad 13 may have any shape other than a square shape shown in FIG. 15.

Eigth Embodiment

Figure 16:
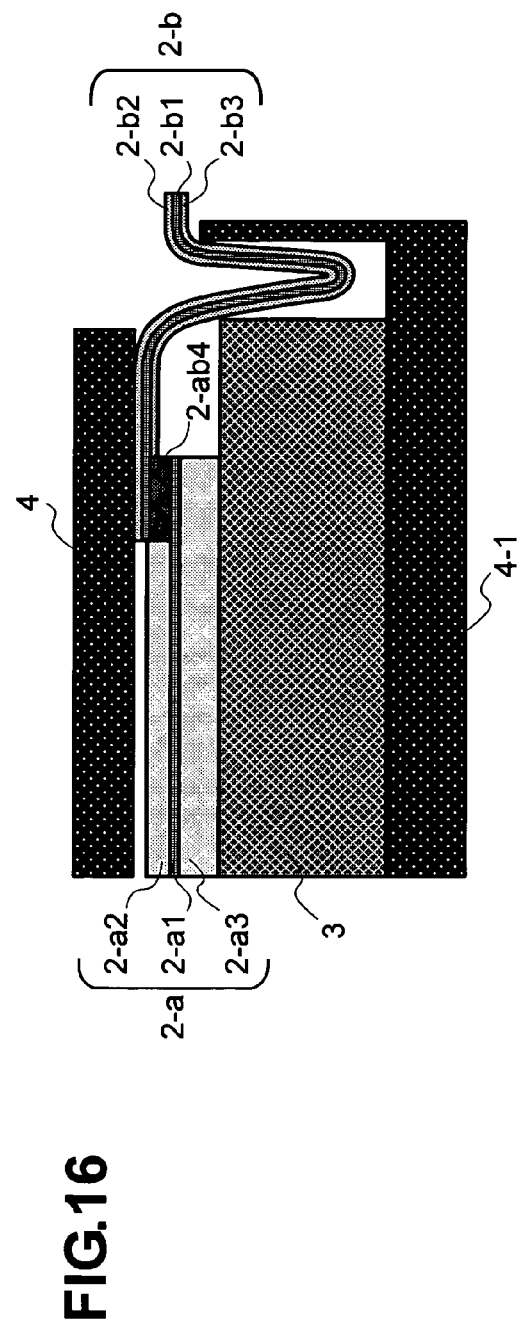
FIG. 16 is a schematic view illustrating an eighth embodiment of the present invention for facilitating further reducing of the stress of the connection sections.

Next, a structure shown in FIG. 16 will be discussed hereinafter. In the structure shown in FIG. 16, stress applied to the flexible substrate can be reduced by causing the second flexible substrate (2-b) to be bent and causing the second flexible substrate to be pressed down by the cover 4, so that the structure of FIG. 16 is effective. In this case, the second flexible substrate (2-b) may be bent several times and pressed down by the under cover (4-1).

Ninth Embodiment

Figure 17:
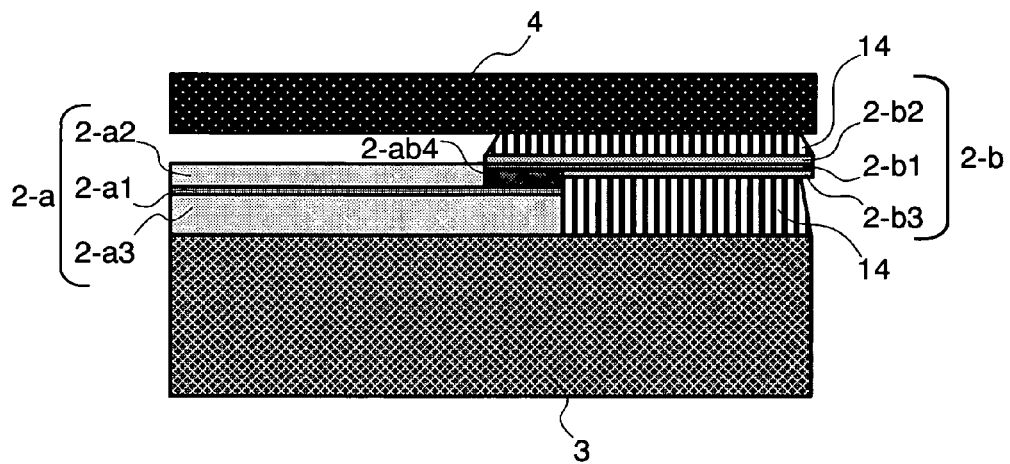
FIG. 17 is a schematic view illustrating a ninth embodiment of the present invention for facilitating further reducing of the stress of the connection sections.

Next, a structure shown in FIG. 17 will be discussed hereinafter. In the structure of FIG. 17, adhesives or adhesive tapes having low modulus of elasticity are applied between the cover 4 and the second flexible substrate (2-b), and between the second flexible substrate (2-b) and the case 3 for optical pick-up. This structure is effective in reducing of stress. Incidentally, they may applied to either of areas between the cover 4 and the second flexible substrate (2-b) and between the second flexible substrate (2-b) and the case 3 for optical pick-up, or both of them.

Tenth Embodiment

Figure 18:
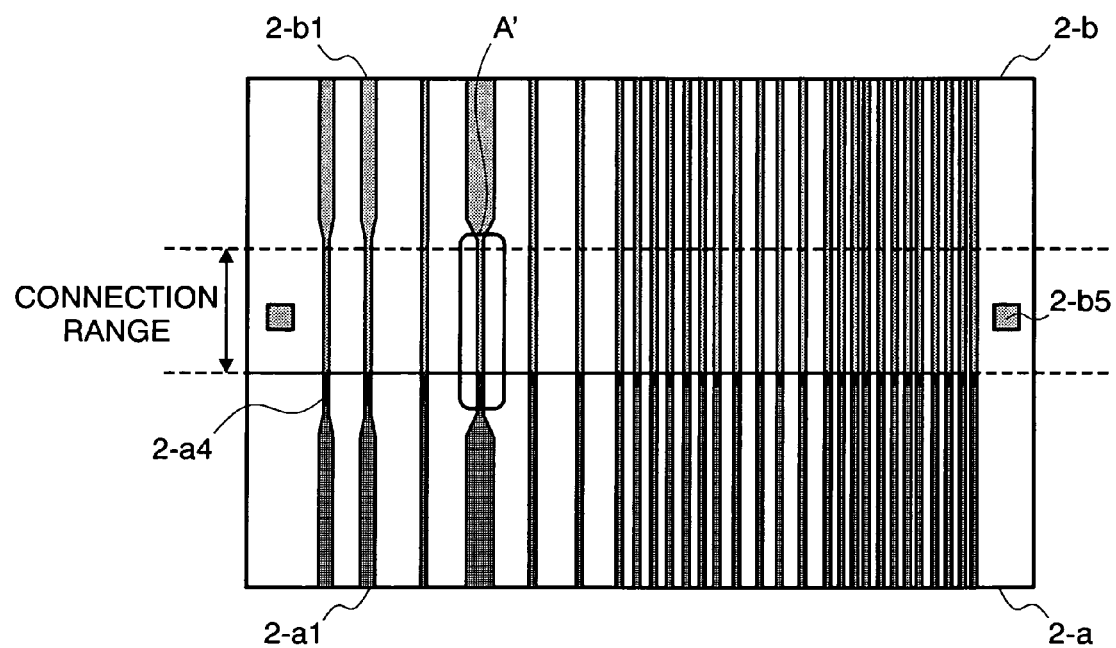
FIG. 18 is a schematic view that is of assistance in explaining shapes of wiring conductors in the connection sections according to the present invention.

Next, a tenth embodiment of the present invention in which the connection is made using solder plating will be discussed hereinafter with reference to FIG. 18. When the end portion of the first flexible substrate (2-a) and the end portion of the second flexible substrate (2-b) are connected to each other, pitches of the wiring conductors to be connected to one another become reduced. If solder plating is employed as the joining material, the thickness of the solder plating (2-a4), (2-b4) (the solder plating is not shown in FIG. 18, since FIG. 18 is a top plan view illustrating the connection section) must be seriously controlled. The reason for this is that if there is a large variation in the thickness of the solder plating, when pressure and heat are applied to, the wiring connection portions which are subjected to positioning are shifted and, in this case, short and poor connection strength may occur due to bridges of the solder.

Figure 19:
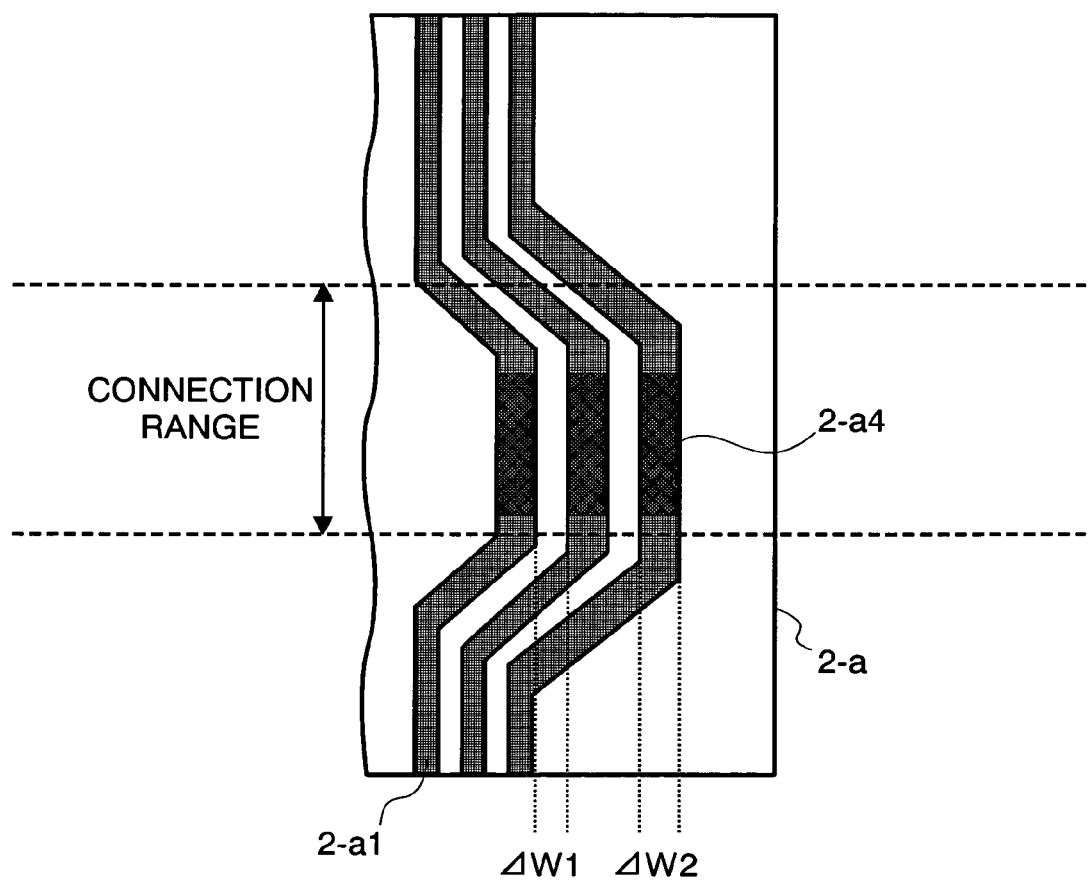
FIG. 19 is a schematic view that is of assistance in explaining shapes of wiring conductors different from the wiring conductors of FIG. 18 in the connection sections according to the present invention.

In the portion of the flexible substrate of the optical pick-up device which is led out from the cover 4, an area which has a wide wiring width as a ground line does, and an area which has a narrow wiring width as a signal wiring has, are present as a mixture, and the narrow wiring width area tends to be deviated toward one side. Therefore, variations in the thickness of the electrolytic solder plating are produced depending upon the width of the wirings. Generally, even if the wiring width is constant, electrical current is concentrated on an end part of the wiring, so that the end portions in the wiring width tend to become thick and the central portion tends to become thin. Moreover, when the area having the wide wiring width and the area having the narrow wiring width are present as a mixture as in the flexible substrate to be employed in the optical pick-up device, the variations tend to be increased. Furthermore, an area having an electrolytic solder plating of a wide width attached thereto tends to become thick in thickness of the electrolytic solder plating, as compared with an area having an electrolytic solder plating of a narrow width attached thereto. As a result, as shown in FIG. 18, variations in thickness of the solder plating (2-a4), (2-b4) (the solder plating is not shown in FIG. 18, since FIG. 18 is a top plan view illustrating the connection section) can be reduced and voids which may be produced due to air entrapment can be reduced, by causing the wiring width of a part A' of the electrolytic solder plating (2-a4), (2-b4) (the solder plating is not shown in FIG. 18, since FIG. 18 is the top plan view illustrating the connection section) to be match the narrow wiring width. In this case, in a high-density wiring portion adjacent an end of the flexible substrate which is shown in FIG. 18, short that is produced by solder bridges can be reduced by widening a distance $\Delta W1$ between adjacent connection section wirings (2-a4) as shown in FIG. 19. Such a way is effective.

Moreover, if it is possible to widen the distance $\Delta W1$ between the connection section wirings to the extent that solder bridges are not produced, connection precision can be improved by widening a width $\Delta W2$ of the connection section wiring (2-a4).

Figure 20:
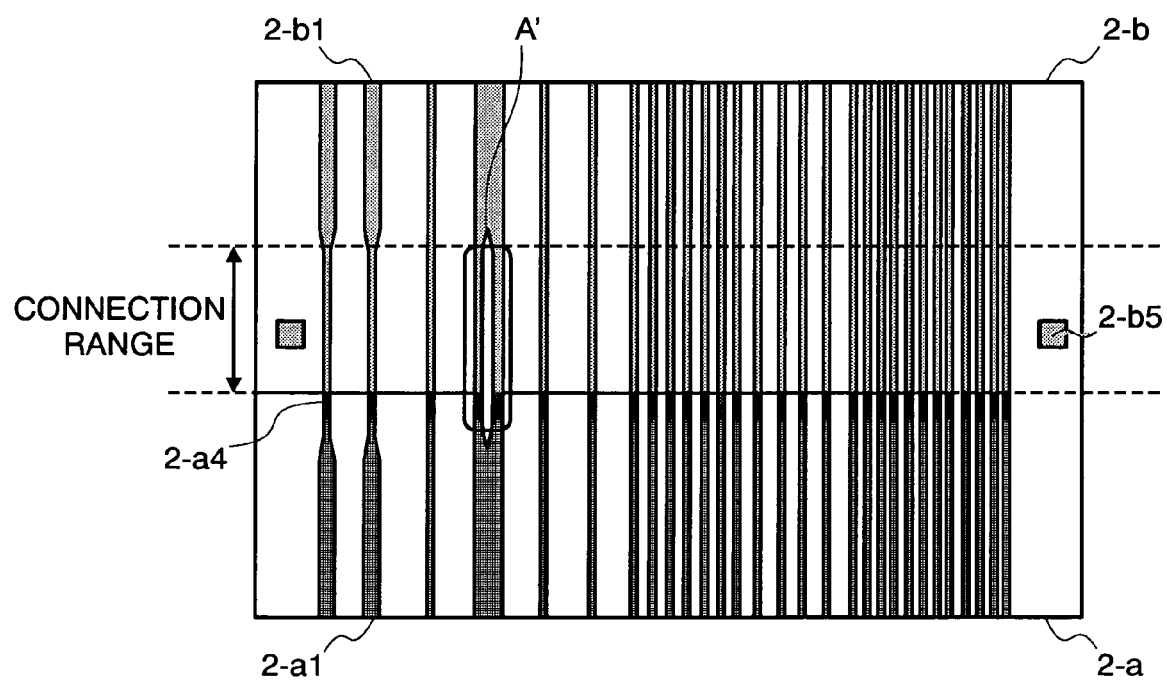
FIG. 20 is a schematic view that is of assistance in explaining shapes of wiring conductors further different from the wiring conductors of FIG. 18 in the connection sections according to the present invention.

Next, another embodiment will be discussed hereinafter with reference to FIG. 20. In the embodiment of FIG. 20, variations in the thickness of the solder plating (2-a4), (2-b4) (the solder plating is not shown in FIG. 20, since FIG. 20 is a top plan view showing the connection section) can be restrained by causing a part having a wide wiring width of the portion A$\alpha$ of the electrolytic solder plating (2-a4), (2-b4) (the solder plating is not shown in FIG. 20, since FIG. 20 is a top plan view illustrating the connection section) to match a narrow wiring width and be divided into several regions, and voids produced due to air entrapment can be reduced.

In accordance with the above-mentioned embodiments, there are provided the following effects.

That is, as performance recently required for the optical pick-up device, thinnerization of the optical pick-up device, or high-functionalization which can allow regeneration and record of not only a CD but also a DVD suiting various standards is required. Moreover, it is presumed that a triple wave length compatible, thin optical pick-up device having a blue semiconductor laser incorporated therein will be required in the future in order to regenerate and record next-generation disk. Therefore, high-densification of the flexible substrate used in the optical pick-up device is further required and the number of layers in the multi-layer structure of the flexible substrate tends to be increased. When the structure according to the present invention is employed, in a thin optical pick-up device that can not use a connector, it is possible to highly densify the first flexible substrate to a multi-layer structure, and make the second flexible substrate thin with attaching of importance to flexibility. Moreover, it is possible considerably reduce damages of the second flexible substrate that are produced due to scratch of the second flexible substrate with the cover on the side of the drive at the time when accessing after the drive is incorporated. Furthermore, the weight of the optical pick-up device must be lightened according to demands for thinnerization of the optical pick-up device. However, it is possible to make an elastic force of the second flexible substrate small by reducing the stiffness of the second flexible substrate and it is possible to reduce prevention of the feed of the optical pick-up device at the time of accessing. Moreover, it is possible to considerably reduce faults in a visual appearance of the second flexible substrate which are produced during manufacturing of the second flexible substrate, and it is possible to considerably increase the yield of the entire optical pick-up device. Incidentally, if solder is applied to the connection section, it is also possible to repair. Moreover, as compared with the conventional integrated flexible substrate, it is possible to considerably increase the number of sth of the first multi-layer flexible substrate to be taken, by causing the multi-layer portion and the single-layer portion to be separated from each other, and it is possible to considerably contribute to cost reduction.

Furthermore, it is possible to meet different specifications for the optical disk drive by changing the second flexible substrate only.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. An optical disk drive apparatus comprising:
an optical pick-up device body having at least a semiconductor chip component mounted thereon;
an optical module having an optical system;
a case for optical pick-up adapted to be reciprocally traveled linearly in a horizontal direction between an inner periphery and an outer periphery of an optical disk;
said optical pick-up device and said optical module being provided at said case;
a drive having a drive apparatus for rotating the optical disk and circuit; and
a flexible substrate for connecting said optical pick-up device body and the drive;
wherein a first flexible substrate is fixed to an upper surface of said optical pick-up device provided at said case for optical pick-up;
wiring conductors on a first connection end portion of said first flexible substrate fixed to said upper surface of said optical pick-up device, and wiring conductors on a second connection end portion of a second flexible substrate produced separately from said first flexible substrate are overlapped and aligned with one another at a region adjacent to an end portion of the case for optical pick-up on the case for optical pick-up, and connected to one another through joining material; and
a connection section in which said wiring conductors of said first connection end portion and said wiring conductors of said second connection end portion are connected to each other at the region adjacent to the end portion of the case for optical pick-up on the case for optical pick-up is pressed down by a cover attached to said optical pick-up case for protecting said optical pick-up device body.

2. An optical disk drive apparatus according to claim 1, wherein the thickness of said first flexible substrate is greater than that of said second flexible substrate.

3. An optical disk drive apparatus according to claim 1, wherein the number of layers of said wiring conductors on said first flexible substrate is increased relative to that of layers of said wiring conductors on said second flexible substrate.

4. An optical disk drive apparatus according to claim 1, wherein said second flexible substrate is made of single-layer wiring conductors and said first flexible substrate is made of multi-layer wiring conductors.

5. An optical disk drive apparatus according to claim 1, connection surfaces of said connection conductors between said first and second connection end portions extend horizontally and said cover is an upper cover.

6. An optical disk drive apparatus according to claim 1, wherein said first connection end portion is bent toward a substantially vertical direction from said first flexible substrate, said second connection end portion is bent toward the substantially vertical direction from said second flexible substrate, connection surfaces of said connection conductors between said first and second connection end portions extend vertically, and said cover is a member which extends from a back cover and is bent toward the substantially vertical direction.

7. An optical disk drive apparatus according to claim 1, wherein said second flexible substrate is formed with a hole adjacent said second connection end portion, said hole being fitted over a circular- or rectangular-protruding portion formed at said case for optical pick-up.

8. An optical disk drive apparatus according to claim 1, wherein said first flexible substrate is formed with a hole adjacent said first connection end portion and said second flexible substrate is formed with a hole adjacent said second connection end portion, said holes being fitted over circular- or rectangular-protruding portions formed at said case for optical pick-up.

9. An optical disk drive apparatus according to claim 1, wherein said first and second flexible substrates are provided at said connection end portions with conductive layers beside said wiring conductors, said conductive layers being connected to each other by a joining material.

10. An optical disk drive apparatus according to claim 1, wherein a width of each of said wiring conductors on said first connection end portion and a width of each of said wiring conductors on said second connection end portion are made substantially uniform within a connection range forming said connection section.

11. An optical disk drive apparatus according to claim 1, wherein a width of each of said wiring conductors on said first connection end portion and a width of each of said wiring conductors on said second connection end portion are divided into several regions within a connection range forming said connection section, and said wiring conductors are each branched and formed uniformly.

12. An optical disk drive apparatus according to claim 1, wherein said joining material is solder.

13. An optical disk drive apparatus according to claim 1, wherein said joining material is anisotropic-conductive-adhesives or anisotropic-conductive film.

14. An optical disk drive apparatus according to claim 1, wherein said first flexible substrate is connected to a sub-flexible substrate to which said optical module is connected.

* * * * *